United States Patent
Kleemans et al.

(10) Patent No.: US 9,964,852 B1
(45) Date of Patent: May 8, 2018

(54) SOURCE COLLECTOR APPARATUS, LITHOGRAPHIC APPARATUS AND METHOD

(71) Applicant: ASML Netherlands B.V., Veldhoven (NL)

(72) Inventors: Niek Antonius Jacobus Maria Kleemans, Eindhoven (NL); Denis Alexandrovich Glushkov, Alfter (DE); Ronald Johannes Hultermans, Waalre (NL); Benedictus Mathijs Renkens, Sittard (NL); Gerardus Hubertus Petrus Maria Swinkels, Eindhoven (NL); Christiaan Johannes Petrus Verspeek, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

(21) Appl. No.: 15/803,448

(22) Filed: Nov. 3, 2017

Related U.S. Application Data

(62) Division of application No. 14/781,262, filed as application No. PCT/EP2014/054221 on Mar. 5, 2014, now Pat. No. 9,841,680.

(Continued)

(51) Int. Cl.
*G03F 7/20* (2006.01)
*H05G 2/00* (2006.01)

(52) U.S. Cl.
CPC ......... *G03F 7/70033* (2013.01); *H05G 2/003* (2013.01); *H05G 2/008* (2013.01)

(58) Field of Classification Search
USPC ..................................... 250/504 R
See application file for complete search history.

(56) References Cited

U.S. PATENT DOCUMENTS 7,872,245 B2 1/2011 Vaschenko et al.
8,698,112 B2 4/2014 Yabu et al.
(Continued)

FOREIGN PATENT DOCUMENTS

CN 102822903 12/2012
EP 1 367 867 12/2003
(Continued)

OTHER PUBLICATIONS

Taiwan Office Action dated Oct. 17, 2017 in corresponding Taiwan Patent Application No. 103111826.
(Continued)

*Primary Examiner* — Kiet T Nguyen
(74) *Attorney, Agent, or Firm* — Pillsbury Winthrop Shaw Pittman LLP

(57) ABSTRACT

A source collector apparatus for use in a lithographic apparatus includes a fuel droplet generator configured in use to generate a stream of fuel droplets directed from an outlet of the fuel droplet generator towards a plasma formation location. In order to prevent droplet satellites from interfering with plasma formation, a gas supply is provided that in use provides a flow of gas (e.g., hydrogen) that deflects any droplet satellites out of the fuel droplet stream. Additionally, a detection apparatus may be provided as part of a shroud to determine the point at which coalescence of fuel droplets occurs thereby providing an indication of the likelihood of satellite droplets being present in the fuel droplet stream.

7 Claims, 3 Drawing Sheets

Related U.S. Application Data

(60) Provisional application No. 61/809,027, filed on Apr. 5, 2013.

(56) References Cited

U.S. PATENT DOCUMENTS

| | | | |
|---|---|---|---|
| 9,795,023 B2* | 10/2017 | Ershov | H05G 2/006 |
| 2004/0105095 A1 | 6/2004 | Stobrawa et al. | |
| 2006/0024216 A1 | 2/2006 | Hergenhan et al. | |
| 2006/0176925 A1 | 8/2006 | Nakano | |
| 2006/0226377 A1 | 10/2006 | Hergenhan et al. | |
| 2007/0001130 A1 | 1/2007 | Bykanov et al. | |
| 2007/0170377 A1 | 7/2007 | Nakano | |
| 2008/0067456 A1 | 3/2008 | Kloepfel et al. | |
| 2009/0014668 A1 | 1/2009 | Vaschenko | |
| 2011/0248191 A1 | 10/2011 | Fomenkov et al. | |
| 2012/0080584 A1 | 4/2012 | Partlo et al. | |
| 2012/0104289 A1 | 5/2012 | Mizoguchi et al. | |
| 2012/0217422 A1 | 8/2012 | Yabu et al. | |
| 2013/0186976 A1 | 7/2013 | Ishihara et al. | |
| 2014/0319387 A1* | 10/2014 | Kim | H05G 2/006 250/504 R |
| 2015/0156855 A1 | 6/2015 | Ershov et al. | |

FOREIGN PATENT DOCUMENTS

| | | |
|---|---|---|
| JP | 2012-212654 | 11/2012 |
| TW | 201230881 | 7/2012 |

OTHER PUBLICATIONS

Orme, Melissa et al., "Electrostatic charging and deflection of nonconventional droplet streams formed from capillary stream breakup", Physics of Fluids, vol. 12, No. 9, Sep. 1, 2000, pp. 2224-2235.

International Search Report dated Aug. 12, 2014 for corresponding International Patent Application No. PCT/EP2014/054221 (7 pages).

Chinese Office Action dated Sep. 5, 2016 for corresponding Chinese Patent Application No. 2014800019323.3 (19 pages).

Chinese Office Action dated May 27, 2017 for corresponding Chinese Patent Application No. 2014800019323.3 (10 pages).

* cited by examiner

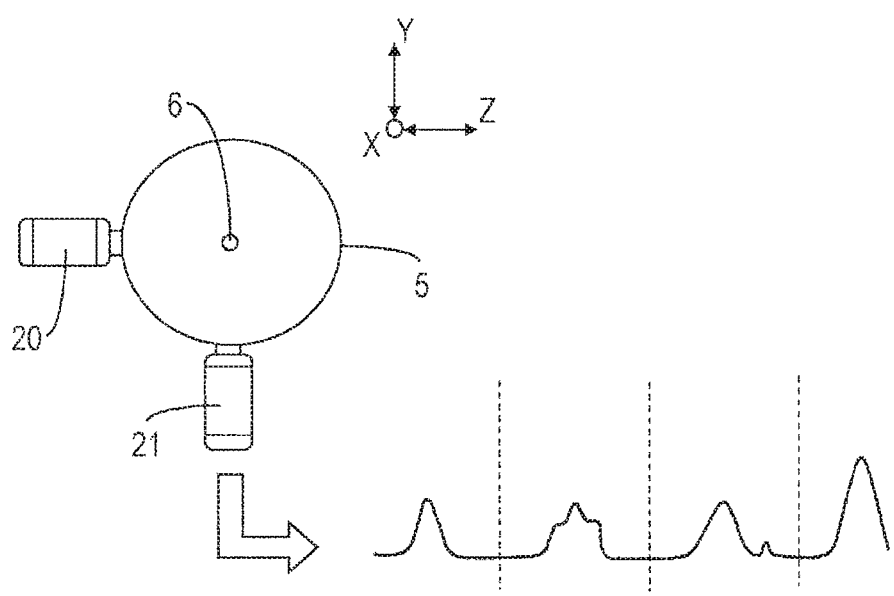
FIG. 5A                    FIG. 5B

SOURCE COLLECTOR APPARATUS, LITHOGRAPHIC APPARATUS AND METHOD

CROSS-REFERENCE TO RELATED APPLICATIONS

This application is a divisional of U.S. patent application Ser. No. 14/781,262, filed on Sep. 29, 2015, which is the U.S. national phase entry of International Patent Application No. PCT/EP2014/054221, filed Mar. 5, 2014, which claims the benefit of U.S. provisional application No. 61/809,027, which was filed on Apr. 5, 2013, both of which are incorporated herein by reference in their entireties.

FIELD

The present invention relates to a source collector apparatus in particular for use in a lithographic apparatus, and to a methods and apparatus for reducing the potentially negative effects of satellite droplets in the fuel droplet stream.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g. tin), or a stream of a suitable gas or vapor, such as Xe gas or Li vapor. The resulting plasma emits output radiation, e.g. EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Fuel droplets are generated by means of a fuel droplet generator. For example fuel droplets may be emitted from a capillary tube under the control of a piezo-electric element. For optimum performance it is important that the fuel droplets coalesce into droplets of the correct size for plasma formation and one known problem is that small droplet satellites may also be formed as a result of non-optimal droplet coalescence. Typically the fuel droplets may have a diameter of around 30 microns whereas the satellite droplets may have a diameter of around 6 am. These sizes may of course vary but give an indication of the relative sizes of regular fuel droplets and unwanted satellite droplets. The presence of such satellite droplets may interfere with the generation of EUV radiation and may reduce the performance of the EUV source. A further disadvantage of the presence of such satellite droplets is that if the EUV source includes a laser in master oscillator power (MOPA) configuration the satellite droplets may cause unwanted EUV generation by firing between droplets In order to minimise the formation of satellite droplets the operational parameters of the fuel droplet generator should be carefully controlled. However, it is found that adjusting the necessary parameters of the fuel droplet generator during operation is a very time consuming process. Furthermore the need to adjust the parameters of the fuel droplet generator may only become apparent when a fall-off in performance has already taken place and wafers have already been wasted owing to an inadequate exposure.

SUMMARY

According to an aspect of the invention there is provided a source collector apparatus, for instance a source collector apparatus constructed to be used in a lithographic apparatus, comprising a fuel droplet generator configured to generate a stream of fuel droplets directed from an outlet of said fuel droplet generator towards a plasma formation location, and a gas supply configured to provide a flow of gas, such as a hydrogen gas flow, directed towards said stream of fuel droplets whereby satellite droplets are deflected out of the fuel droplet stream.

In embodiments of the invention the source collector apparatus further comprises a shroud extending generally parallel to said fuel droplet stream and wherein said flow of gas extends from an outlet provided in or near said shroud.

The flow of gas may be formed as a single gas stream or may be formed of a plurality of individual gas streams. Preferably the flow of gas lies in a plane and the fuel droplet stream is generally perpendicular to the plane.

In preferred embodiments of the invention the flow of gas is configured such that in use any satellite droplets are deflected such that in use they do not pass through a laser beam used to generate a plasma from the fuel droplets.

In preferred embodiments of the invention the source collector apparatus further comprises a detecting apparatus constructed and arranged to detect the coalescence of fuel droplets in the fuel droplet stream. The detecting apparatus may for example be an optical detecting apparatus or an electro-magnetic detecting apparatus.

In preferred embodiments of the invention the detecting apparatus is formed as part of said shroud. For example, the detecting apparatus may comprise a plurality of light sources disposed on a first side of the fuel stream and a plurality of corresponding detectors disposed on an opposed second side of the fuel stream. Alternatively the detecting apparatus may comprise first and second electromagnetic sensors disposed around the fuel stream. The sensors may formed as part of said shroud.

According to another aspect of the invention there is provided a source collector apparatus, for instance a source collector apparatus constructed to be used in a lithographic apparatus, comprising a fuel droplet generator configured to generate a stream of fuel droplets directed from an outlet of said fuel droplet generator towards a plasma formation location, a shroud constructed and arranged to protect the stream of fuel droplets, and further comprising a detecting apparatus constructed and arranged to detect the coalescence of fuel droplets in the fuel droplet stream as it passes along said shroud.

In preferred embodiments of the invention the detecting apparatus is incorporated in said shroud.

In preferred embodiments of the invention the detecting apparatus is an optical detecting apparatus or an electro-magnetic detecting apparatus. For example the detecting apparatus may comprise a plurality of light sources disposed on a first side of the fuel stream and a plurality of corresponding detectors disposed on an opposed second side of the fuel stream. In another embodiment the detecting apparatus may comprise first and second electromagnetic sensors disposed around the fuel stream.

According to another aspect of the invention there is provided a lithographic apparatus comprising the source collector apparatus as described above, and further comprising; an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

According to a further aspect of the invention there is provided a method of removing satellite droplets from the fuel droplet stream of a source collector apparatus, said fuel droplet stream extending in a first direction, the method comprising directing a flow of gas towards said fuel droplet stream to impart a differential velocity to said satellite droplets relative to fuel droplets in a second direction.

According to a still further aspect of the invention there is provided a method of detecting formation of satellite droplets in the fuel droplet stream of a source collector apparatus wherein said fuel droplet stream is generated by a fuel droplet generator and wherein said fuel droplet stream is protected by a shroud, the method comprising providing apparatus for detecting the location in said shroud where coalescence of fuel droplets occurs.

One or more aspects of the invention may, where appropriate to one skilled in the art, be combined with any one or more other aspects described herein, and/or with any one or more features described herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which-corresponding reference symbols indicate corresponding parts, and in which:

FIGS. 5A and 5B show respectively a schematic view of a further embodiment of the invention and examples of detected signals.

Figure 1:
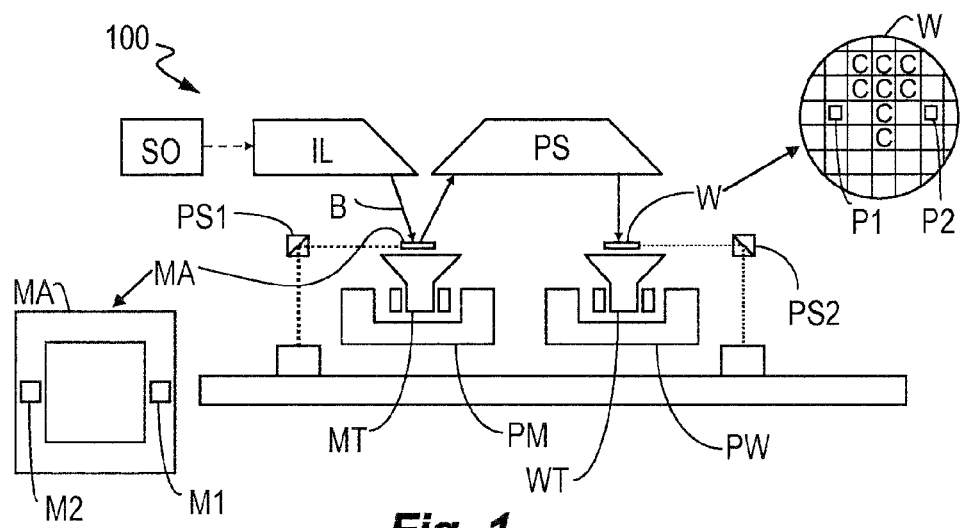
FIG. 1 schematically depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DERAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a source collector apparatus SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device:

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a CO2 laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator II, may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1. P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is-kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
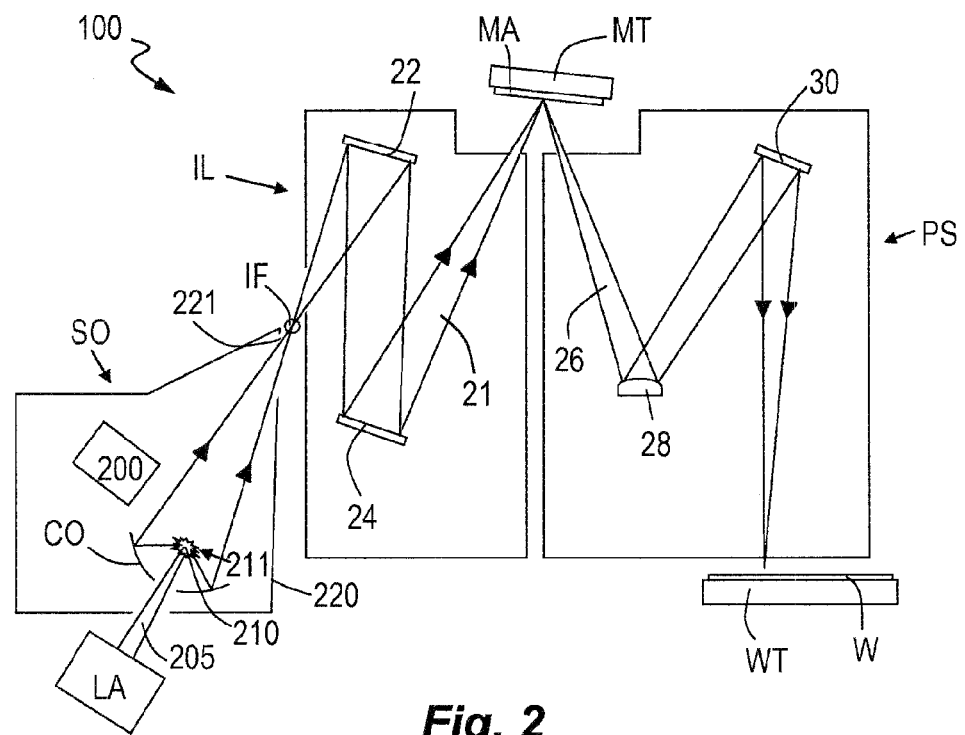
FIG. 2 is a more detailed schematic view of the lithographic apparatus.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a laser produced plasma (LPP) source. EUV radiation may be produced by a gas or vapor, for example Xe gas, Li vapor or Sn vapor in which the very hot plasma 210 is created to emit radiation in the EUV range of the electromagnetic spectrum. As will be discussed in more detail below in the case of a laser produced plasma (LPP) source the very hot plasma 210 is created by configuring laser LA to emit a beam of laser radiation 205 that is focused on target area 211 to which is supplied a first fuel, eg a droplet of tin (Sn), from a first fuel supply. The laser generates a plasma of Sn vapour which emits EUV radiation as is known in the art.

The source module SO further includes a radiation collector CO which collects the generated EUV radiation and focuses the EUV radiation at a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

Figure 3:
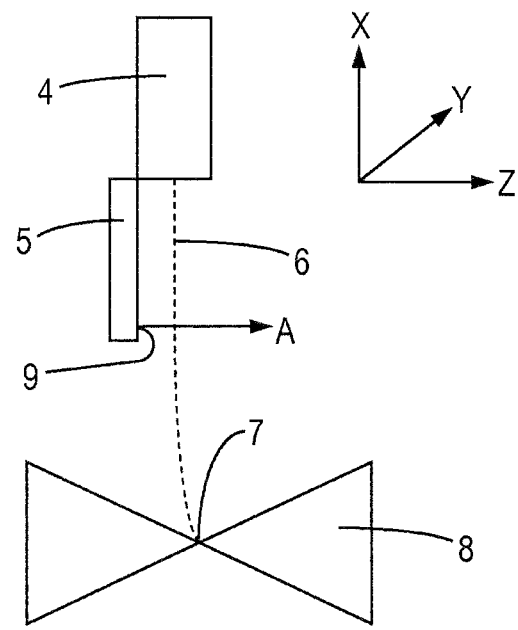
FIG. 3 is a schematic view of a first embodiment of the invention.

Referring now to FIG. 3 there is shown in more detail a part of the radiation source SO comprising a fuel droplet generator 4 and a shroud 5. Fuel droplet generator 4 is configured to generate a stream of fuel droplets 6 (for example droplets of molten tin) directed towards a plasma formation point 7 which is at the focus of a pulsed laser beam 8 where the fuel droplets are vaporised by the pulsed laser beam 8 to form an EUV-generating plasma.

Together with fuel droplets 6 there may also be generated very small fuel fragments known as satellite droplets that result from incomplete coalescence of the fuel droplets. By way of example a fuel droplet may have a typical diameter of about 30 microns whereas a satellite droplet may have a typical diameter of only 6 microns. The presence of such satellite droplets has a negative effect on the EUV generation and while the generation of satellite droplets may be minimised by adjustment of the operating parameters of the fuel droplet generator 4, the requirement to have to adjust the droplet generator parameters can be inconvenient as discussed above.

In an embodiment of the invention a supply of gas (eg hydrogen gas) is supplied to the shroud 5 which is provided with at least one outlet 9 from which the gas is directed in the direction indicated by arrow A towards the droplet stream. In the embodiment of FIG. 3 the hydrogen is supplied from the end of the shroud in the z direction generally parallel to the axis of the laser beam. The effect of the hydrogen gas is to deflect the fuel droplet stream as shown in FIG. 3, and in particular the smaller satellite droplets will be displaced by a greater distance than the fully formed fuel droplets because the hydrogen gas flow will have a greater displacement effect on the lower mass satellite droplets. Thus it will be understood that though the satellite droplets still cross the laser beam they will not do so at the plasma formation location and will not interfere, or will interfere only to a much smaller extent, with the plasma formation and EUV generation. It will also be understood that the hydrogen could be provided so as to flow in a different direction, eg the y axis at right angles to the axis of the laser beam, whereby the deflection of the satellite droplets is such that they do not pass through the laser beam at all.

In the embodiment of FIG. 3 the hydrogen gas is supplied from an outlet provided at the end of the shroud remote from the fuel droplet generator. However, it will be understood that the outlet may be provided at any location along the length of the shroud, and indeed that more than one outlet may be provided, or that an elongate slit-like outlet extending along the length of the shroud may be provided.

The hydrogen flow rate should be such as to ensure that the satellite droplets are displaced relative to the fuel droplets by a sufficient extent to ensure that they do not interfere with the EUV generation. This distance may vary depending on whether the satellite droplets are displaced completely out of the laser beam (ie in the y direction) or along the laser beam (ie in the z direction), but typically a distance of the order of 200 microns may be suitable. This may be achieved, for example, by applying to the satellite droplets a differential velocity with respect to the fuel droplets of about 1 m/s over a distance of 20 cm. It will of course be understood that these figures are not intended to be limiting and are indicative figures only.

It may also be noted that satellite droplets may be detected by detecting the offset between the fuel droplet stream and the satellite droplets as a lower intensity signal (or by using an additional quad detector) using a droplet illumination module or a droplet detection module. In such a manner it may be confirmed that the satellite droplets have been deflected by a sufficient distance.

In the embodiment of FIG. 3 the effect of any satellite droplets is minimised by displacing the satellite droplets from the fuel droplet stream by applying a differential velocity. It may, however, also be preferable to provide an apparatus for detecting the presence of satellite droplets whereby the operating parameters of the fuel droplet generator may be adjusted to minimise satellite droplet formation. Such a detecting apparatus may use any suitable technology for detecting and characterising the fuel droplet stream, including for example optical and electromagnetic techniques. An example of such an embodiment is shown in FIG. 4.

Figure 4:
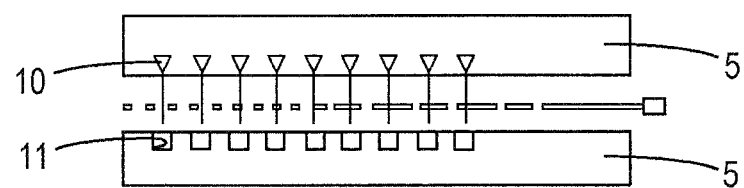
FIG. 4 is a schematic view of a second embodiment of the invention.

In the embodiment of FIG. 4 apparatus is incorporated into the shroud 5 to monitor the coalescence of the droplets along the length of the shroud 5. When the fuel droplets coalesce at an earlier stage there is better stability of the fuel droplet stream with minimal creation of satellite droplets, whereas if the fuel droplets coalesce later there is a greater likelihood of satellite droplets being formed. Determining at what point along the shroud coalescence occurs therefore gives a good indication of the likelihood of satellite droplets being formed.

In the embodiment of FIG. 4 the shroud 5 has two surfaces that are provided facing each other with the fuel droplet stream between them. The shroud 5 may therefore be a tubular shroud that completely surrounds the fuel droplet stream, or may be a C-shaped shroud with three sides. Along one side of the shroud 5 is provided an array of LED lasers 10, while along the opposing side there is provided a corresponding array of detectors 11. It will be understood that the presence and characteristics of the fuel droplet stream may be detected by the timing and manner in which the fuel droplet stream interrupts the detection of radiation emitted from the LED lasers. A "good" fuel droplet stream will be one where the fuel droplets coalesce early in the stream, ie close to the outlet nozzle of the fuel droplet generator. A "bad" fuel droplet stream will be one where the fuel droplets only coalesce much further downstream from the nozzle outlet of the fuel droplet generator. If the detection apparatus detects that fuel droplets are only coalescing close to the end of the shroud downstream from the nozzle outlet, then the operating parameters of the fuel droplet generator may be adjusted accordingly.

FIGS. 5A and 5B show an embodiment of the invention in which electro-magnetic induction is used to detect the presence of satellite droplets. As shown in FIG. 5A, which shows a section through a tubular shroud 5, in this embodiment of the invention, two electromagnetic sensors 20,21 are provided oriented at 90° to each other (though this particular angle is not essential and others may be chosen). The presence of a fuel droplet between the sensors 20,21 changes the electro-magnetic field detected and thus a signal output by the sensors 20,21 may be used to detect the presence of fuel droplets. It will be understood that the sensors 20,21 may be provided at any point along the shroud, or indeed that multiple pairs of sensors may be provided at different locations along the shroud. A particular advantage of this embodiment is that in addition to providing information relating to fuel droplet coalescence, the sensors can also provide information regarding the position of the fuel droplets and any fragmentary satellite droplets as is shown by the example detected signals shown in FIG. 5B. From the left-hand side of the figure, the four example signals show respectively: a fuel droplet with good coalescence; parallel fragments displaced in the Z or Y directions; a fuel droplet with a satellite droplet in the X direction; and a droplet shifted in the Y direction.

It will be understood that while in the embodiments of FIGS. 4, 5A and 5B the apparatus for detecting fuel droplet coalescence is formed as part of the shroud, this may not necessarily be the case in particular if the shroud is at least partially open, eg a shroud with a C-shaped cross-section, in which case a droplet detection module may be used to detect the location along the shroud at which the fuel droplets coalesce.

It will be understood that deflecting satellite droplets away from the fuel droplet stream and determining when fuel droplet coalescence occurs in the fuel droplet stream are concepts that may be employed either in combination or independently.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measure or process an object such as a wafer (or other substrate) or mask (or other patterning device) either in vacuum or in ambient (non-vacuum) conditions, such as, for example in plasma etching apparatus or deposition apparatus.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

The invention claimed is:

1. A source collector apparatus comprising a fuel droplet generator configured to generate a stream of fuel droplets directed from an outlet of said fuel droplet generator towards a plasma formation location, a shroud constructed and arranged to protect the stream of fuel droplets, and a detecting apparatus constructed and arranged to detect the coalescence of fuel droplets in the fuel droplet stream as it passes along said shroud.

2. A source collector apparatus as claimed in claim 1, wherein said detecting apparatus is incorporated in said shroud.

3. A source collector apparatus as claimed in claim 1, wherein said detecting apparatus is an optical detecting apparatus or an electro-magnetic detecting apparatus.

4. A source collector apparatus as claimed in claim 3, wherein said detecting apparatus comprises a plurality of light sources disposed on a first side of the fuel stream and a plurality of corresponding detectors disposed on an opposed second side of the fuel stream.

5. A source collector apparatus as claimed in claim 4, wherein said detecting apparatus comprises first and second electromagnetic sensors disposed around the fuel stream.

6. A method of detecting formation of satellite droplets in the fuel droplet stream of a source collector apparatus wherein said fuel droplet stream is generated by a fuel droplet generator and wherein said fuel droplet stream is protected by a shroud, the method comprising providing an apparatus for detecting the location in said shroud where coalescence of fuel droplets occurs.

7. A lithographic apparatus comprising a source collector apparatus comprising a fuel droplet generator configured to generate a stream of fuel droplets directed from an outlet of said fuel droplet generator towards a plasma formation location, a shroud constructed and arranged to protect the stream of fuel droplets, and a detecting apparatus constructed and arranged to detect the coalescence of fuel droplets in the fuel droplet stream as it passes along said shroud.

* * * * *